United States Patent
Arbel et al.

(10) Patent No.: US 12,237,287 B2
(45) Date of Patent: *Feb. 25, 2025

(54) CHIP BUMP INTERFACE COMPATIBLE WITH DIFFERENT ORIENTATIONS AND TYPES OF DEVICES

(71) Applicant: XILINX, INC., San Jose, CA (US)

(72) Inventors: Ygal Arbel, Morgan Hill, CA (US); Kenneth Ma, Cupertino, CA (US); Balakrishna Jayadev, Mountain View, CA (US); Sagheer Ahmad, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/369,115

(22) Filed: Sep. 15, 2023

(65) Prior Publication Data

US 2024/0014161 A1   Jan. 11, 2024

Related U.S. Application Data

(63) Continuation of application No. 17/235,843, filed on Apr. 20, 2021, now Pat. No. 11,784,149.

(51) Int. Cl.
| | |
|---|---|
| *G11C 5/00* | (2006.01) |
| *G11C 5/06* | (2006.01) |
| *H01L 23/00* | (2006.01) |
| *H01L 23/538* | (2006.01) |
| *H01L 25/065* | (2023.01) |

(52) U.S. Cl.
CPC .............. *H01L 24/16* (2013.01); *G11C 5/063* (2013.01); *H01L 23/5384* (2013.01); *H01L 25/0657* (2013.01); *H01L 2224/16225* (2013.01); *H01L 2225/0651* (2013.01); *H01L 2924/1434* (2013.01)

(58) Field of Classification Search
USPC ............................................ 365/189.011, 63
See application file for complete search history.

(56) References Cited

U.S. PATENT DOCUMENTS

| | | | | |
|---|---|---|---|---|
| 10,410,694 | B1 * | 9/2019 | Arbel | G06F 11/1044 |
| 11,784,149 | B1 * | 10/2023 | Arbel | H01L 25/0657 |
| | | | | 365/189.011 |
| 2019/0385780 | A1 * | 12/2019 | Xu | H01F 27/2804 |
| 2020/0006236 | A1 * | 1/2020 | Collins | H01L 23/481 |

* cited by examiner

*Primary Examiner* — Tan T. Nguyen

(74) *Attorney, Agent, or Firm* — Patterson + Sheridan, LLP

(57) ABSTRACT

Embodiments herein describe a multiple die system that includes an interposer that connects a first die to a second die. Each die has a bump interface structure that is connected to the other structure using traces in the interposer. However, the bump interface structures may have different orientations relative to each other, or one of the interface structures defines fewer signals than the other. Directly connecting the corresponding signals defined by the structures to each other may be impossible to do in the interposer, or make the interposer too costly. Instead, the embodiments here simplify routing in the interposer by connecting the signals in the bump interface structures in a way that simplifies the routing but jumbles the signals. The jumbled signals can then be corrected using reordering circuitry in the dies (e.g., in the link layer and physical layer).

20 Claims, 17 Drawing Sheets

| 120C | 120D | 120C | 120D | 120C | 120D | 120C | 120D |
|---|---|---|---|---|---|---|---|
| ecc0 | dbi3 | ecc1 | dbi2 | sev0 | dbi1 | sev1 | dbi0 | rd0 | derr |
| dq0 | dq31 | dq8 | dq23 | dq16 | dq15 | dq24 | dq7 | rd1 | dpar |
| dq1 | dq30 | dq9 | dq22 | dq17 | dq14 | dq25 | dq6 | dpar | rd1 |
| dq2 | dq29 | dq10 | dq21 | dq18 | dq13 | dq26 | dq5 | derr | rd0 |
| dq3 | dq28 | dq11 | dq20 | dq19 | dq12 | dq27 | dq4 | wdqst | rdqsc |
| dq4 | dq27 | dq12 | dq19 | dq20 | dq11 | dq28 | dq3 | wdqsc | rdqst |
| dq5 | dq26 | dq13 | dq18 | dq21 | dq10 | dq29 | dq2 | rdqst | wdqsc |
| dq6 | dq25 | dq14 | dq17 | dq22 | dq9 | dq30 | dq1 | rdqsc | wdqst |
| dq7 | dq24 | dq15 | dq16 | dq23 | dq8 | dq31 | dq0 | | |
| dbi0 | sev1 | dbi1 | sev0 | dbi2 | ecc1 | dbi3 | ecc0 | | |

TABLE 500

FIG. 5

| Repaired Lane | Reorder Pattern |
|---|---|
| none | [9,8,7,6,5,4,3,2,1,0], and dpar ↔ derr |
| any | [8,7,6,5,4,3,2,1,0,9], and dpar ↔ derr |

TABLE
900

0: [1, 0, 3, 2, 5, 4, 7, 6, 9, 8]   no repair
1: [0, 2, 1, 4, 3, 6, 5, 8, 7, 9]   repair in lanes 0 or 1
2: [1, 0, 2, 4, 3, 6, 5, 8, 7, 9]   repair in lanes 2 or 3
3: [1, 0, 3, 2, 4, 6, 5, 8, 7, 9]   repair in lanes 4 or 5
4: [1, 0, 3, 2, 5, 4, 6, 8, 7, 9]   repair in lanes 6 or 7
5: [1, 0, 3, 2, 5, 4, 7, 6, 8, 9]   repair in lanes 8 or 9

FIG. 9

TABLE
1100

0: [8, 9, 6, 7, 4, 5, 2, 3, 0, 1]   no repair
1: [7, 8, 5, 6, 3, 4, 1, 2, 0, 9]   repair in lanes 0 or 1
2: [7, 8, 5, 6, 3, 4, 2, 0, 1, 9]   repair in lanes 2 or 3
3: [7, 8, 5, 6, 4, 2, 3, 0, 1, 9]   repair in lanes 4 or 5
4: [7, 8, 6, 4, 5, 2, 3, 0, 1, 9]   repair in lanes 6 or 7
5: [8, 6, 7, 4, 5, 2, 3, 0, 1, 9]   repair in lanes 8 or 9

FIG. 11

| 120A | 1205 | 120A | 1205 | 120A | 1205 | 120A | 1205 | 120A | 1205 |
|------|------|------|------|------|------|------|------|------|------|
| ecc0 | c0   | ecc1 | r2   | sev0 | x    | sev1 | x    | rd0  | aerr |
| dq0  | c1   | dq8  | r1   | dq16 | x    | dq24 | x    | rd1  | x    |
| dq1  | c2   | dq9  | r0   | dq17 | x    | dq25 | x    | dpar | ra   |
| dq2  | c3   | dq10 | r3   | dq18 | x    | dq26 | x    | derr | x    |
| dq3  | c4   | dq11 | r5   | dq19 | x    | dq27 | x    | wdqst | ckt |
| dq4  | c6   | dq12 | r4   | dq20 | x    | dq28 | x    | wdqsc | ckc |
| dq5  | c5   | dq13 | r6   | dq21 | x    | dq29 | x    | rdqst | x   |
| dq6  | apar | dq14 | r7   | dq22 | x    | dq30 | x    | rdqsc | x   |
| dq7  | c7   | dq15 | r8   | dq23 | x    | dq31 | x    |      |      |
| dbi0 | rfu  | dbi1 | r9   | dbi2 |      | dbi3 | x    |      |      |

TABLE 1300

FIG. 13

| 120A | 1405 | 120A | 1405 | 120A | 1405 | 120A | 1405 |
|---|---|---|---|---|---|---|---|
| ecc0 | r2 | ecc1 | c0 | sev0 | x | sev1 | aerr |
| dq0 | r1 | dq8 | c1 | dq16 | x | dq24 | x |
| dq1 | r0 | dq9 | c2 | dq17 | x | dq25 | ra |
| dq2 | r3 | dq10 | c3 | dq18 | x | dq26 | x |
| dq3 | r5 | dq11 | c4 | dq19 | x | dq27 | ckc |
| dq4 | r4 | dq12 | c6 | dq20 | x | dq28 | ckt |
| dq5 | r6 | dq13 | c5 | dq21 | x | dq29 | x |
| dq6 | r7 | dq14 | apar | dq22 | x | dq30 | x |
| dq7 | r8 | dq15 | c7 | dq23 | x | dq31 | |
| dbi0 | r9 | dbi1 | rfu | dbi2 | x | dbi3 | |

TABLE 1500

FIG. 15

| DW Byte 0 | DW Byte 1 | DW Byte 2 | DW Byte 3 | AWORD Byte 0 | AWORD Byte 1 | Numerical ID |
|---|---|---|---|---|---|---|
| ecc0 | ecc1 | sev0 | sev1 | c0 | r1 | 0 |
| dq0 | dq8 | dq16 | dq24 | c1 | r2 | 1 |
| dq1 | dq9 | dq17 | dq25 | c2 | r3 | 2 |
| dq2 | dq10 | dq18 | dq26 | c3 | r0 | 3 |
| dq3 | dq11 | dq19 | dq27 | c4 | r4 | 4 |
| dq4 | dq12 | dq20 | dq28 | c5 | r5 | 5 |
| dq5 | dq13 | dq21 | dq29 | c6 | r6 | 6 |
| dq6 | dq14 | dq22 | dq30 | c7 | r7 | 7 |
| dq7 | dq15 | dq23 | dq31 | apar | r8 | 8 |
| dbi0 | dbi1 | dbi2 | dbi3 | rfu | r9 | 9 |

TABLE 1600

FIG. 16

| Orientation | TXByte | TXBit | RXByte | RXBit | Byte0 Table | Byte1 Table |
|---|---|---|---|---|---|---|
| 'TRUE' | 0 | -1 | 0 | -1 | 0 | 1 |
| 'TRUE' | 0 | 0 | 0 | 0 | 2 | 1 |
| 'TRUE' | 0 | 1 | 0 | 1 | 2 | 1 |
| 'TRUE' | 0 | 2 | 0 | 2 | 2 | 1 |
| 'TRUE' | 0 | 3 | 0 | 3 | 2 | 1 |
| 'TRUE' | 0 | 4 | 0 | 4 | 2 | 1 |
| 'TRUE' | 0 | 5 | 0 | 5 | 3 | 1 |
| 'TRUE' | 0 | 6 | 0 | 6 | 3 | 1 |
| 'TRUE' | 0 | 7 | 0 | 7 | 4 | 1 |
| 'TRUE' | 0 | 8 | 0 | 8 | 4 | 1 |
| 'TRUE' | 0 | 9 | 0 | 9 | 0 | 1 |
| 'TRUE' | 1 | -1 | 1 | -1 | 0 | 5 |
| 'TRUE' | 1 | 0 | 1 | 1 | 0 | 5 |
| 'TRUE' | 1 | 1 | 1 | 0 | 0 | 6 |
| 'TRUE' | 1 | 2 | 1 | 3 | 0 | 6 |
| 'TRUE' | 1 | 3 | 1 | 2 | 0 | 7 |
| 'TRUE' | 1 | 4 | 1 | 5 | 0 | 7 |
| 'TRUE' | 1 | 5 | 1 | 4 | 0 | 1 |
| 'TRUE' | 1 | 6 | 1 | 6 | 0 | 1 |
| 'TRUE' | 1 | 7 | 1 | 7 | 0 | 1 |
| 'TRUE' | 1 | 8 | 1 | 8 | 0 | 1 |
| 'TRUE' | 1 | 9 | 1 | 9 | 0 | 0 |
| 'MX' | 0 | -1 | 1 | -1 | 1 | 0 |
| 'MX' | 0 | 0 | 1 | 1 | 5 | 0 |
| 'MX' | 0 | 1 | 1 | 0 | 5 | 0 |
| 'MX' | 0 | 2 | 1 | 3 | 6 | 0 |
| 'MX' | 0 | 3 | 1 | 2 | 6 | 0 |
| 'MX' | 0 | 4 | 1 | 5 | 7 | 0 |
| 'MX' | 0 | 5 | 1 | 4 | 7 | 0 |
| 'MX' | 0 | 6 | 1 | 6 | 1 | 0 |
| 'MX' | 0 | 7 | 1 | 7 | 1 | 0 |
| 'MX' | 0 | 8 | 1 | 8 | 1 | 0 |
| 'MX' | 0 | 9 | 1 | 9 | 1 | 0 |
| 'MX' | 0 | -1 | 0 | -1 | 1 | 0 |
| 'MX' | 0 | 0 | 0 | 0 | 1 | 2 |
| 'MX' | 1 | 1 | 0 | 1 | 1 | 2 |
| 'MX' | 1 | 2 | 0 | 2 | 1 | 2 |
| 'MX' | 1 | 3 | 0 | 3 | 1 | 2 |
| 'MX' | 1 | 4 | 0 | 4 | 1 | 2 |
| 'MX' | 1 | 5 | 0 | 5 | 1 | 3 |
| 'MX' | 1 | 6 | 0 | 6 | 1 | 3 |
| 'MX' | 1 | 7 | 0 | 7 | 1 | 4 |
| 'MX' | 1 | 8 | 0 | 8 | 1 | 4 |
| 'MX' | 1 | 9 | 0 | 9 | 1 | 0 |

FIG. 18

CHIP BUMP INTERFACE COMPATIBLE WITH DIFFERENT ORIENTATIONS AND TYPES OF DEVICES

CROSS REFERENCE TO RELATED APPLICATION

This application is a continuation of U.S. Non-Provisional application Ser. No. 17/235,843, filed on Apr. 20, 2021 of which is incorporated herein by reference in its entirety.

TECHNICAL FIELD

Examples of the present disclosure generally relate using the same chip bump interface to form connections between multiple chips (or dies) which may have interfaces with different orientations, or use a sub-portion of the bump interface.

BACKGROUND

Using chiplets to build larger devices is an emerging technology. A key part of it is the chip-to-chip (C2C) interface technology, such as the one based on Joint Electron Device Engineering Council (JEDEC) high bandwidth memory (HBM3) standard. The C2C interface reuses the HBM3 definition of a DWORD, a 48-signal block with its particular micro-bump structure, as the basic interface unit. A typical C2C interface may contain, for example, 32 such DWORDs along a side of a die (e.g., chip or integrated circuit).

The C2C interface is optimized for short reach physical connections over a medium such as silicon interposer or equivalent. It is therefore important to optimize signal routing on the interposer by maximizing straight line connections and avoiding need for signal jogging or crisscrossing. Thus, current C2C or chip to HBM connections rely on ensuring the DWORDs on both chips have the same orientation. When two interconnected dies have the same C2C DWORD structure orientation, optimal signal routing is ensured by the original HBM3 DWORD structure definition.

SUMMARY

One embodiment describes a multiple die system that includes an interposer, a first die, and a second die. The first die includes a first bump interface structure connected, using microbumps, to the interposer and a first communication layer coupled to the first bump interface structure and including first reordering circuitry. The second die includes a second bump interface structure connected, using microbumps, to the interposer and a second communication layer coupled to the second bump interface structure and comprising second reordering circuitry. Further, the interposer includes a plurality of traces electrically connecting the first and second bump interface structures that jumble signals defined by the first and second bump interface structures. Moreover, the first and second bump interface structures have at least one of (i) different orientations relative to each other or (ii) different interface structures such that one of the first and second bump interface structures defines fewer signals than the other.

Another embodiment described herein is a method that includes providing a multiple die system comprising two dies with respective bump interface structures interconnected by an interposer such that signals defined by the respective bump interface structures are jumbled by the interposer, transmitting the signals in a jumbled state between the two dies, and performing a bit-level reordering within multiple bytes of data in the signals.

Another embodiment described herein is an integrated circuit that includes a first bump interface structure configured to connect, using microbumps, to an interposer, wherein the interposer permits the first bump interface structure to communicate with a second bump interface structure in a different integrated circuit and a communication layer coupled to the first bump interface structure and comprising reordering circuitry. The reordering circuitry is configured to correct jumbled signals received at the first bump interface structure due to at least one of (i) different orientations between the first and second bump interface structures, or (ii) one of the first and second bump interface structures defining fewer signals than the other.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 5 is a table indicating the mapping between the two bump interface structures in FIG. 4B, according to an example.

FIG. 9 is a table for reordering data transmitted between two bump interface structures with different orientations, according to an example.

FIG. 11 is a table for reordering data transmitted between two bump interface structures with different orientations, according to an example.

FIG. 13 is a table indicating the mapping between the two bump interface structures in FIG. 12, according to an example.

FIG. 15 is a table indicating the mapping between the two bump interface structures in FIG. 14, according to an example.

FIG. 16 is a table, according to an example.

FIG. 18 is a table, according to an example.

DETAILED DESCRIPTION

Figure 1A:
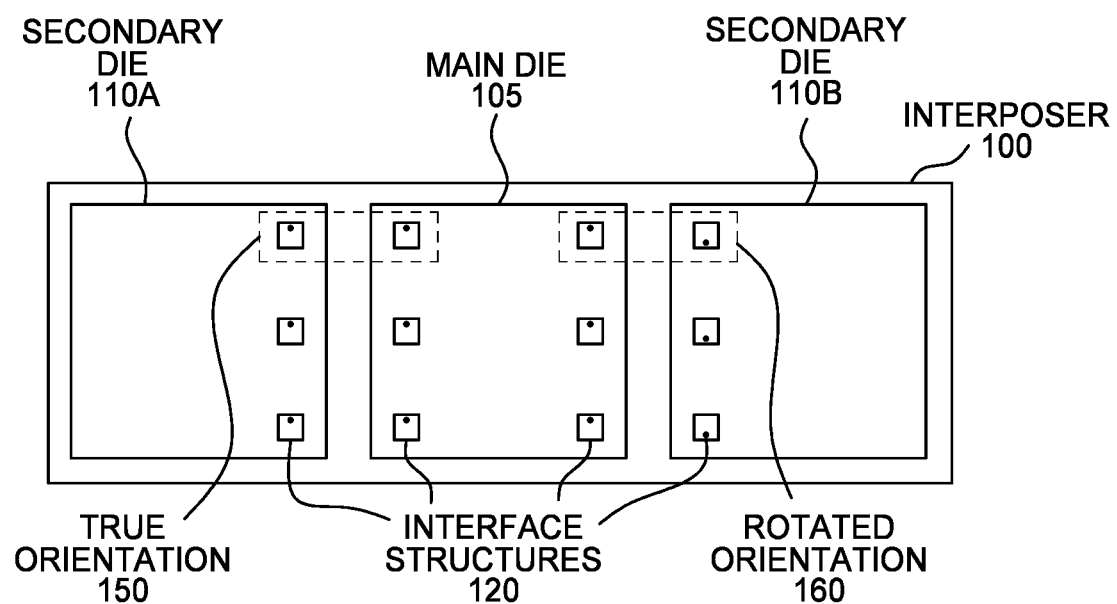
FIGS. 1A and 1B illustrate connecting multiple dies using an interposer, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe interconnecting bump interface structures in two dies (e.g., between two field programmable gate arrays (FPGAs), two application specific integrated circuits (ASICs), two system on chips (SoCs), or between a die and a memory (e.g., high bandwidth memory (HBM)). The bump interface structures in the two dies may have different orientations relative to each other (e.g., one DWORD is rotated 180 degrees relative to the other DWORD), or one die may have a bump interface structure that is a different size than the bump interface structure on the other chip (e.g., a DWORD on a first die that is connected to an AWORD (HBM3 definition of an Address Word, a 24-signal block with its particular micro-bump structure). The HBM standard has no support for interconnecting dies in which the C2C DWORD structure does not have the same orientation, or for connecting a DWORD to an AWORD.

The embodiments herein describe reordering circuitry in the connected dies that reorder data that was jumbled due to connecting bump interface structures with different orientations, or connecting two different types of bump interface structures. Doing so permits a die manufacturer to arrange the dies (and the bump interface structures on the die) in any order they desire and still have the ability to connect the die to other dies without worrying about the relative orientations of the bump interface structures, or the types of the bump interface structures.

Figure 1B:
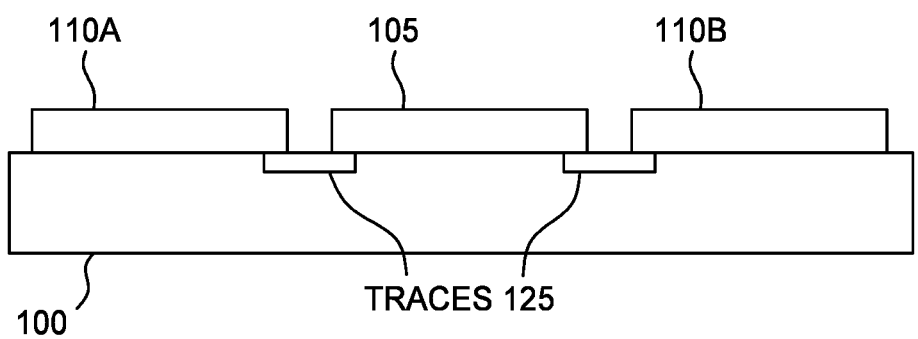

FIGS. 1A and 1B illustrate connecting multiple dies using an interposer, according to an example. FIG. 1A illustrates a computing system that includes an interposer 100 providing electrical connections between a main die 105 and two secondary dies 110A and 110B. In this example, the main die 105 and secondary dies 110 are disposed on a same surface of the interposer 100 (e.g., a silicon interposer). Although three dies (e.g., integrated circuits (IC)) are shown, the interposer 100 could also be extended to permit the main die 105 to connect to secondary dies at its top and bottom, rather than only the right and left sides as shown.

The dies 105, 110 include interface structures 120 (also referred to as bump interface structures) that define mappings for microbump connections between the dies 105, 110 and the interposer 100. The interface structures 120 can indicate which microbumps (which can be made using solder) correspond to which signal being transmitted between the dies 105, 110. These signals can include data signals, clock signals, error correction signals, lane repair signals, and the like. Because the microbumps are mapped to specific signals, the orientation of the interface structures 120 matters. A top side of the interface structures 120 is indicated by the dots on each structure 120.

FIG. 1A illustrates that the interface structures 120 in the main die 105 are all orientated such that their top sides are oriented up in the figure. This is the same for the secondary die 110A. However, the interface structures 120 on the secondary die 110B are orientated with the top side facing down in the figure. For example, the secondary dies 110A and 110B may the same type of chip (e.g., a memory chip, an accelerator, etc.). As such, in order for the interface structures 120 on the secondary die 110B to be directly adjacent to the interface structures 120 in the main die 105, the secondary die 110B is rotated 180 degrees relative to the secondary die 110A. Doing so ensures the interface structures 120 on the die 110B are directly adjacent to the interface structures 120 in the main die 105. While the die 110B could have the same orientation as the die 110A, this would mean its interface structures 120 would now be on the right side of the die 110B and no longer adjacent to the interface structures 120 in the main die 105. To connect these interface structures 120, it would require much longer traces in the interposer 100 which adds additional cross-talk, parasitic capacitance, and cost. Further, these traces would extend beneath the center of the secondary die 110B in order to reach the main die 105. The centers of the dies 105, 110 are often reserved for power signals and other types of communication, and thus, may not be available to route the traces for connecting the interface structures 120. As such, to avoid these issues, the secondary die 110B is rotated 180 degrees so that the interface structures 120 are adjacent to each other which greatly reduces the length of the traces in the interposer 100 and overall cost.

However, due to the rotation of the main die 105 and the secondary die 110B, the interface structures 120 in the main die 105 and the secondary die 110B have a rotated orientation 160 relative to each other. That is, the interface structure 120 in the main die 105 is rotated 180 degrees relative to the interface structure 120 in the secondary die 110B. As discussed below in FIGS. 4A-4B, this rotated orientation 160 can create complications when attempting to connect the corresponding microbumps using the interposer 100. In contrast, the interface structures 120 in the main die 105 and the secondary dies 110A have a true orientation 150 since the structures 120 have the same orientation. The true orientation 150 is discussed in FIG. 3.

The main and secondary dies 105, 110 can be ASICs, SoCs, FPGAs, graphics processors, memories (e.g., HBM), processors, and the like. Further, while FIG. 1A illustrates a main die 105 connected to secondary dies 110, the dies may all be main dies. Moreover, while two secondary dies 110 are shown, the main die 105 may have interface structures 120 along the top and bottom sides so that the main die 105 can be connected to additional secondary dies disposed at these sides. In addition, the interposer can be made of any material (e.g., a semiconductor) that permits it to include traces for connecting the microbumps corresponding to the interface structures 120 in the various dies.

FIG. 1B illustrates a side view of the compute system illustrated in FIG. 1A. As shown, the interposer 100 include traces 125 that extend between the main die 105 and the secondary dies 110. Although not shown, the dies 105, 110 are connected to the interposer using microbumps which create electrical and mechanical connections between the dies 105, 110 and the interposer 100. The traces 125 then connect the microbumps through the interposer 100. The traces 125 can be made of any suitable conductive material.

Figure 2:
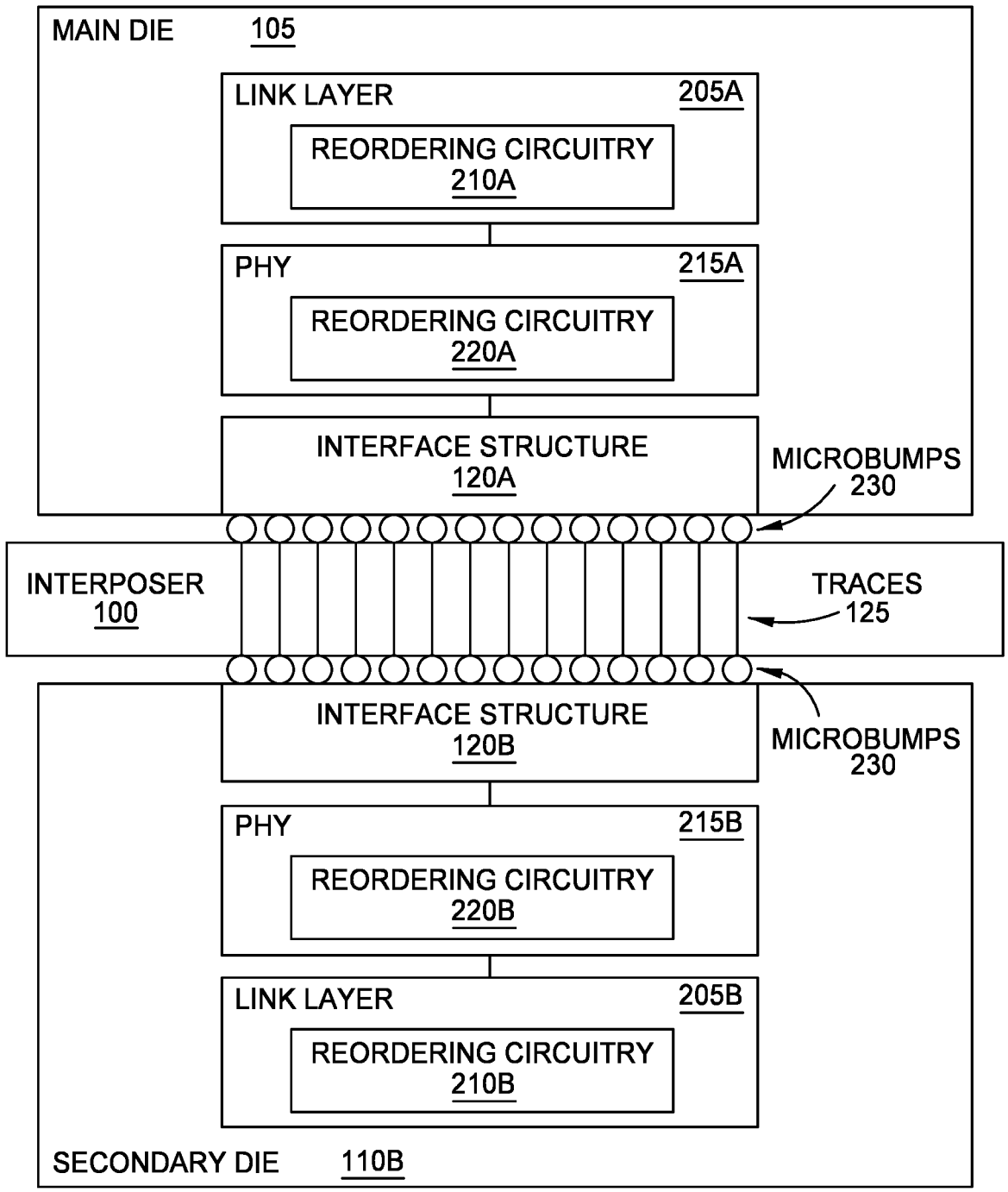
FIG. 2 is logical view of the connections in FIGS. 1A and 1B, according to an example.

FIG. 2 is logical view of the connections in FIGS. 1A and 1B, according to an example. The main die 105 includes a link layer 205A (e.g., a first communication layer) connected to a physical layer (PHY) 215A (e.g., a second communication layer) which is in turn connected to the interface structure 120A. The secondary die 110B also includes a link layer 205B connected to a PHY 215B which is in turn connected to the interface structure 120B. Using the link layers 205 and the PHYs 215, the main die 105 and the secondary die 110B can transfer data (e.g., data packets) through the interposer 100 (or more specifically, using the traces 125 in the interposer 100). FIG. 2 also illustrates microbumps 230 which electrically connect the interposer 100 to the dies 105, 110B.

As will be described in more detail in FIGS. 4A and 4B, the link layers 205 and PHYs 215 include reordering circuitry 210, 220 for reordering bits that are unordered (i.e., jumbled) due to connecting interface structures 120 with different orientations (e.g., the rotated orientation 160 in FIG. 1A). In one embodiment, the reordering circuitry 210, 220 can be selectively enabled and disabled. For example, if the interface structures 120A and 120B have the true orientation 150 in FIG. 1A, then the reordering circuitry 210, 220 may not be used since the bits are not jumbled. Alternatively, the reordering circuitry 210, 220 is enabled when the interface structures 120A and 120B have the rotated orientation 160. Further, there may be different relative orientations between the interface structures 120 (e.g., the relative orientations illustrated in FIGS. 8 and 10) which can also be supported by the reordering circuitry 210, 220. Put differently, the reordering circuitry 210, 220 can include logic for handling a variety of different relative orientations between the interface structures 120A and 120B.

Figure 3:
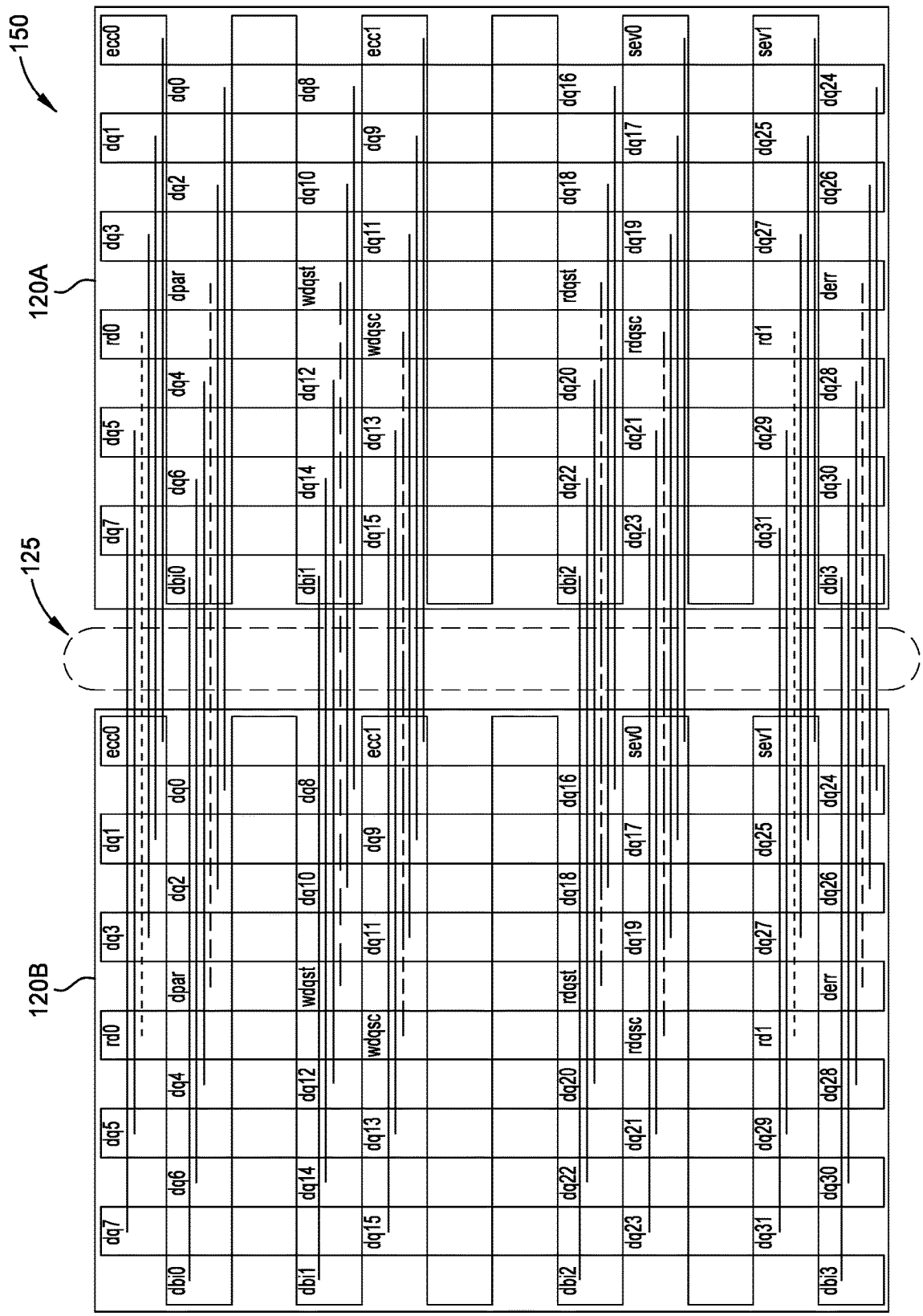
FIG. 3 illustrates a trace layout connecting two bump interface structures, according to an example.

FIG. 3 illustrates a trace layout connecting two bump interface structures, according to an example. Specifically, FIG. 3 illustrates two interface structures with the true orientation 150 on an interposer. Further, FIG. 3 illustrates the traces 125 (or more generally, electrically connections) between the respective bump locations in the interfaces 120. For example, the dq7 location in the structure 120A is connected by a trace to the dq7 location in the structure 120B, the dq5 location in the structure 120A is connected by a trace to the dq5 location in the structure 120B, the rd0 location in the structure 120A is connected by a trace to the rd0 location in the structure 120B, and so forth.

The traces 125 extend in straight, parallel lines as they interconnect the various bump locations in the interface structures 120. As such, routing the traces 125 in the interposer is much easier than compared to routing non-parallel traces 125 that crisscross since the traces 125 can be routed side by side on the same layer in the interposer (assuming there is sufficient space). Thus, when the interface structures 120 have the true orientation 150, the corresponding bump locations (and the signals corresponding to those locations) can be interconnected using the easy-to-route traces 125 in FIG. 3, which will be contrasted to the example in FIG. 4A where the interface structures 120 have a different relative orientation.

The interface structures 120 in FIG. 3 are DWORDs based on JEDEC HBM3 standard. However, the embodiments herein are not limited to DWORDs but can be used with any orientation-dependent bump interface structure. Put differently, the techniques herein can be applied to other bump interface structures where the orientation of the structures changes how the bump locations line up with another structure. In this example, the dq bump locations indicate 32 data signals, the dbi indicate four data bus inversion signals, the rd bump locations (i.e., rd0 and rd1) indicate redundant signals used for lane repair, the ecc, and sev locations are error correction signals, and the wdqs and rdqs are for clock signals.

Figure 4A:
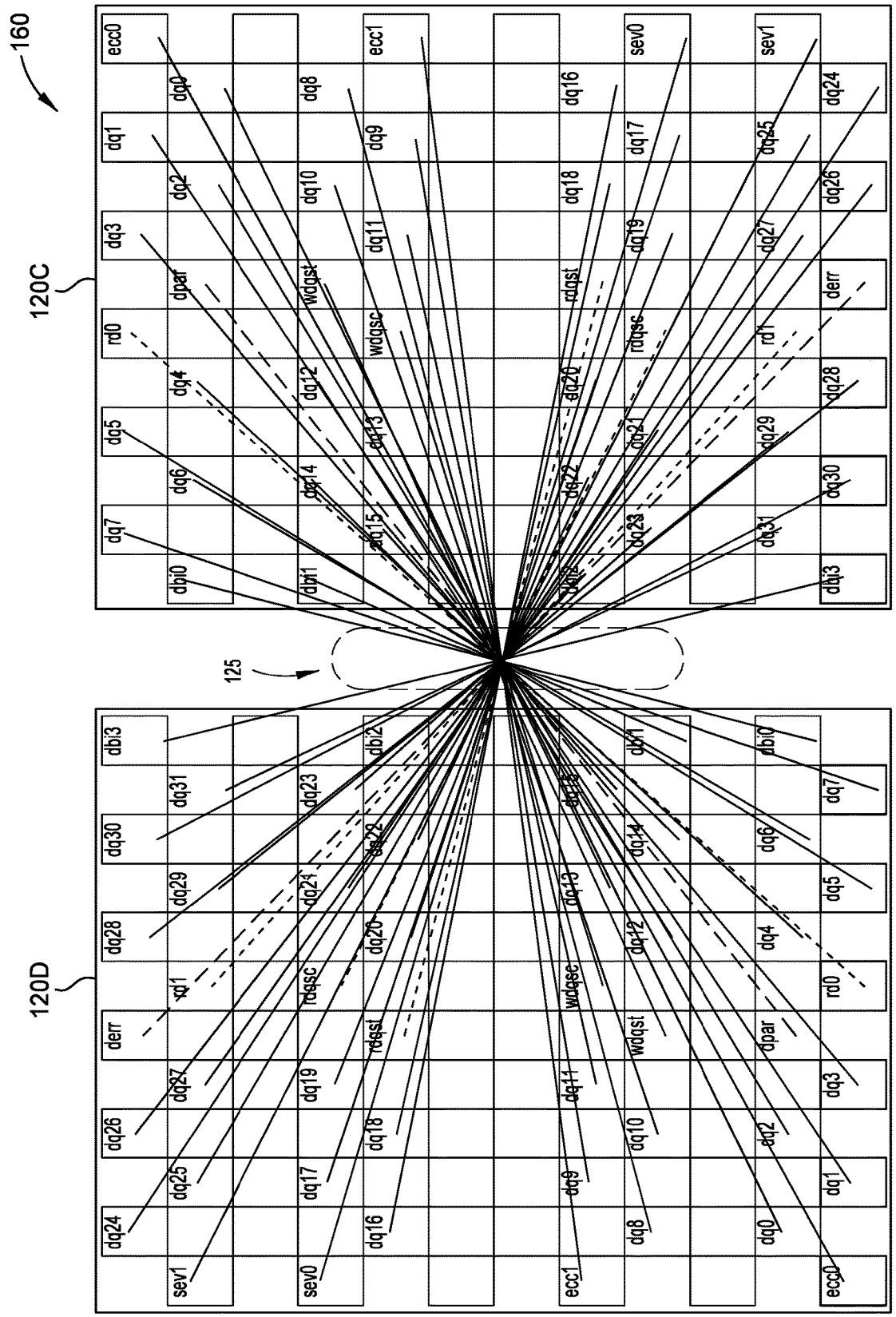
FIGS. 4A and 4B illustrate trace layouts connecting two bump interface structures, according to an example.
Figure 4B:
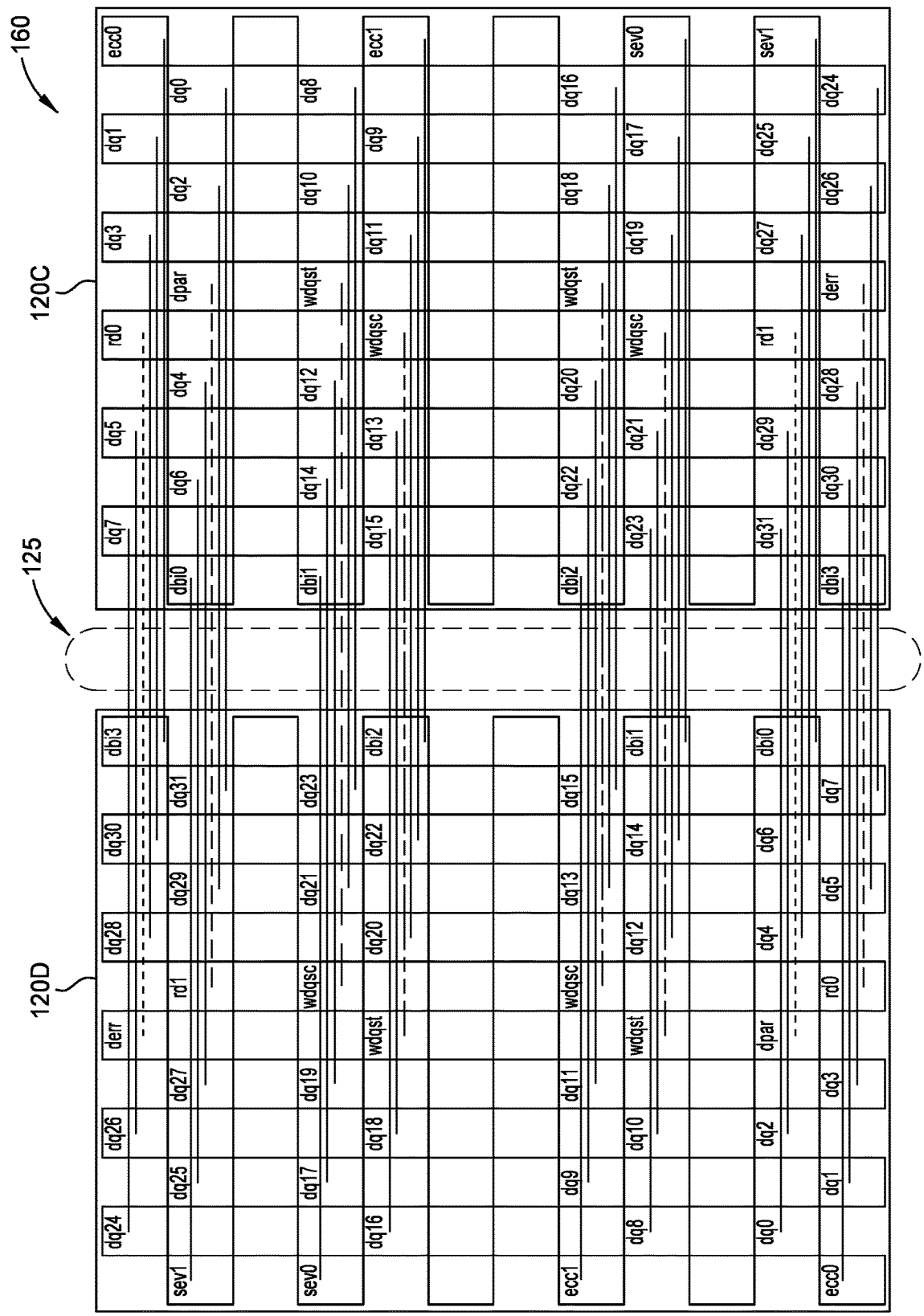

FIGS. 4A and 4B illustrate trace layouts connecting two bump interface structures, according to an example. In FIG. 4A, bump interface structures 120C and 120D (e.g., DWORDs) have the rotated orientation 160 where the structure 120D is rotated 180 degrees relative to the structure 120C. As illustrated in FIG. 1A, this orientation 160 may occur when a secondary die is rotated so its interface structure will be adjacent to the interface structure on the main die.

To electrically connect the corresponding bump locations in the two interface structures (e.g., to connect dq7 to dq7, dq5 to dq5, and rd0 to rd0, etc.), the traces 125 cross each other. That is, unlike in FIG. 3 where the traces 125 are parallel and do not cross, in FIG. 4A, to connect the same signals in each of the interface structure 120, the traces 125 cross other traces. This makes routing the traces 125 in the interposer much more difficult. Every location where traces 125 cross typically means the traces have to be routed on different layers in the interposer. This makes the interposer much more complex and expensive. As such, simply connecting the same bump locations in the interface structures 120 and relying on the interposer 100 to handle the complicated routing between the locations is difficult and may be impossible to achieve.

FIG. 4B illustrates the same rotated orientation 160 of the interface structures 120C and 120D in FIG. 4A except that the bump locations have been interconnected using the trace routing scheme illustrated in FIG. 3. That is, the traces 125 are arranged in straight, parallel lines when connecting the bump locations in the interface structure 120C to the bump locations in the interface structure 120D. As such, the complexity and the cost of the interposer are greatly reduced relative to the trace routing scheme illustrated in FIG. 4A.

However, connecting the bump locations as shown in FIG. 4B jumbles the signals. For example, now dq7 in the structure 120C is connected to dq24 in the structure 120D, dq5 in the structure 120C is connected to dq26 in the structure 120D, rd0 in the structure 120C is connected to derr in the structure 120D, and so forth. As such, the data transmitted between the dies using the structures 120C and 120D is mis-ordered due to the traces 125 connecting different, non-corresponding bump/signal locations.

FIG. 5 is a table 500 indicating the mapping between the two bump interface structures in FIG. 4B, according to an example. That is, the table 500 indicates the how signal or bump locations in the interface structure 120C are connected to the signal or bump locations in the interface structure 120D.

Figures 6, 7:
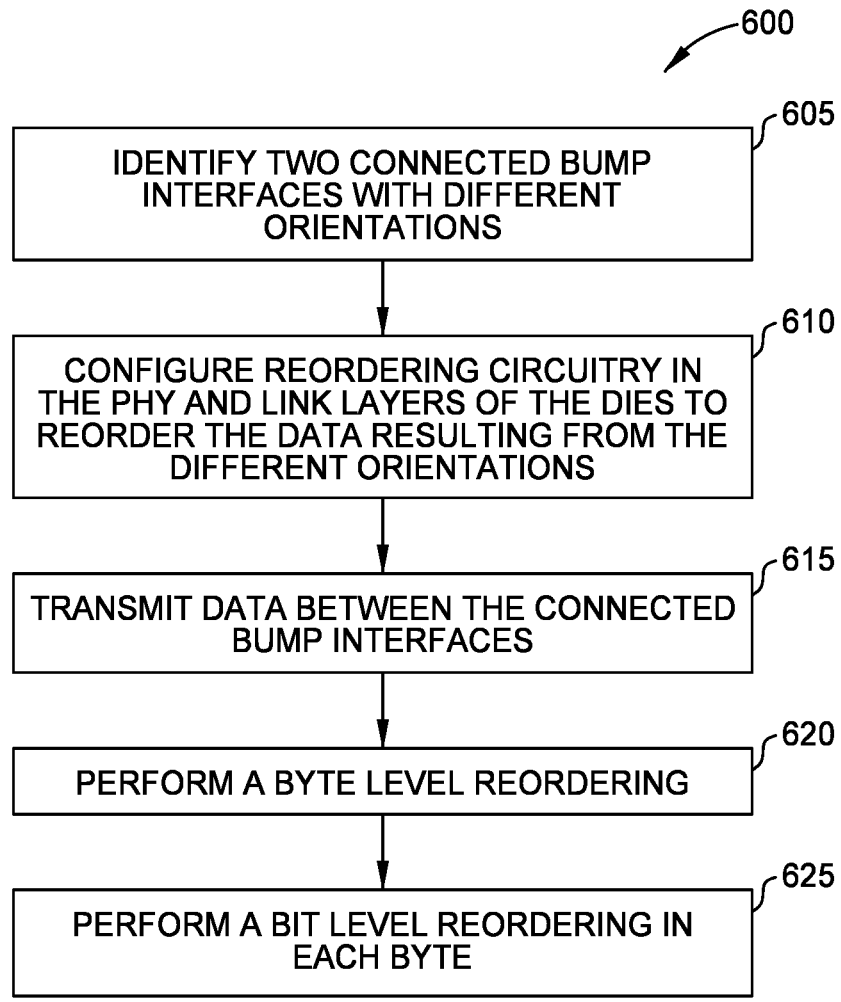
FIG. 6 is a flowchart for reordering data transmitted between two bump interface structures with different orientations, according to an example.
FIG. 7 is a table indicating logic for lane repair between interface structures with different orientations, according to an example.

FIG. 6 is a flowchart of a method 600 for reordering data transmitted between two bump interface structures with different orientations, according to an example. That is, FIG. 6 illustrates a method 600 for correcting (or reordering) the jumbled signals caused by connecting two bump interface structures (which have different orientations) using the trace connection scheme illustrated in FIG. 4B. As illustrated in FIG. 2, the dies can include reordering circuitry 210, 220 in the PHY and link layers for reordering the signals.

At block 605, a user (or detection logic in the dies) identify two connected bump interfaces with different orientations. For example, a system designer may recognize that the secondary die 110B in FIG. 1A has been rotated such that its interface structures now have a different orientation than the interface structures in the main die.

At block 610, the user configures reordering circuitry in the PHY and link layers of the dies to reorder the data resulting from the different orientations. That is, the reordering circuitry may be selectively enabled depending on whether its corresponding PHY and link layers are coupled to interface structures with different orientations. If not, the reordering circuitry may be disabled. Further, the reordering circuitry may support performing signal reordering for different types of relative orientations between the bump interface structures (such as the orientations that will be discussed in FIGS. 8 and 10). The user can then configure the reordering circuitry to use the appropriate reordering technique depending on the particular orientation of the bump interface structures the circuitry is connected to.

Figure 8:
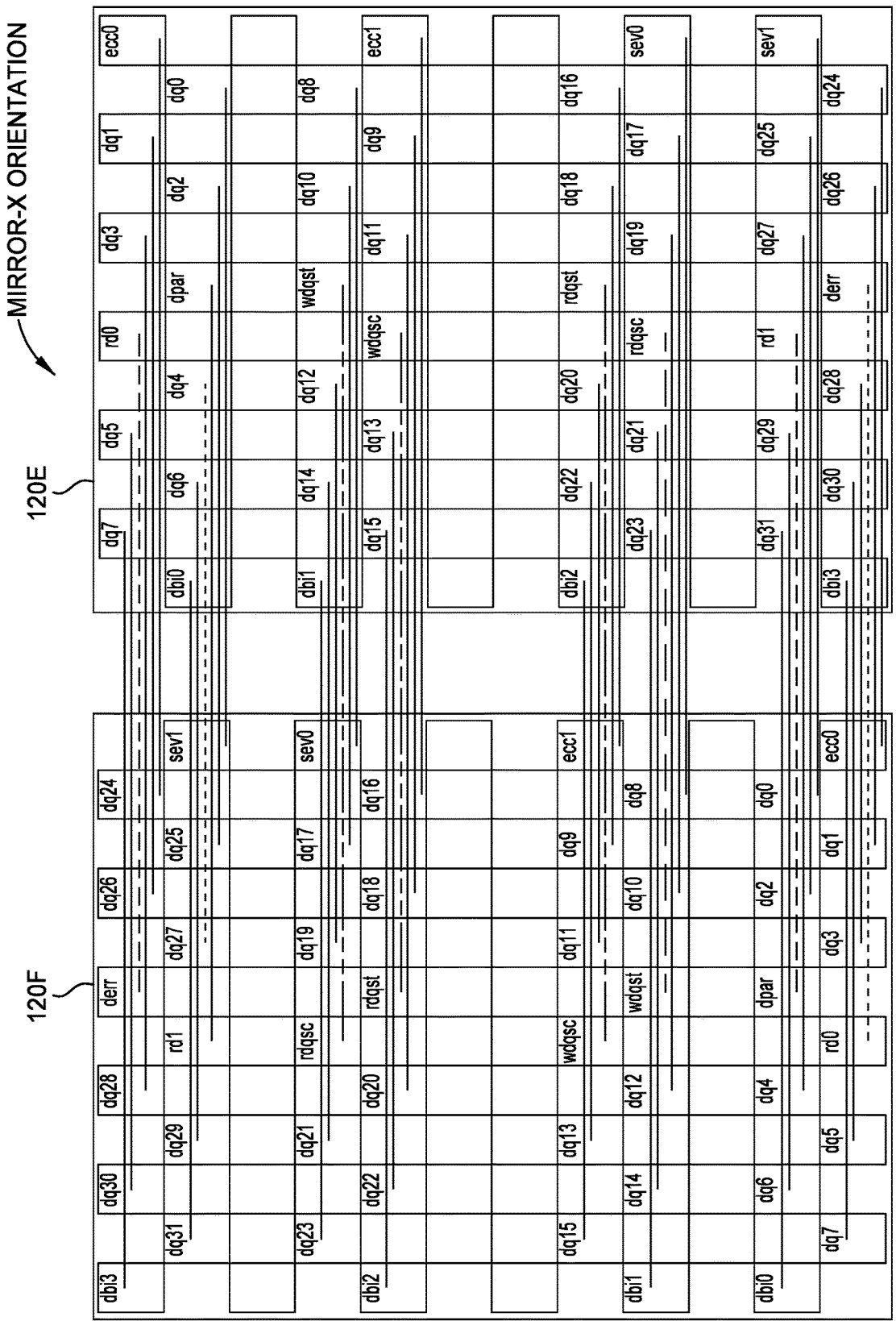
FIG. 8 illustrates a trace layout connecting two bump interface structures, according to an example.
Figure 10:
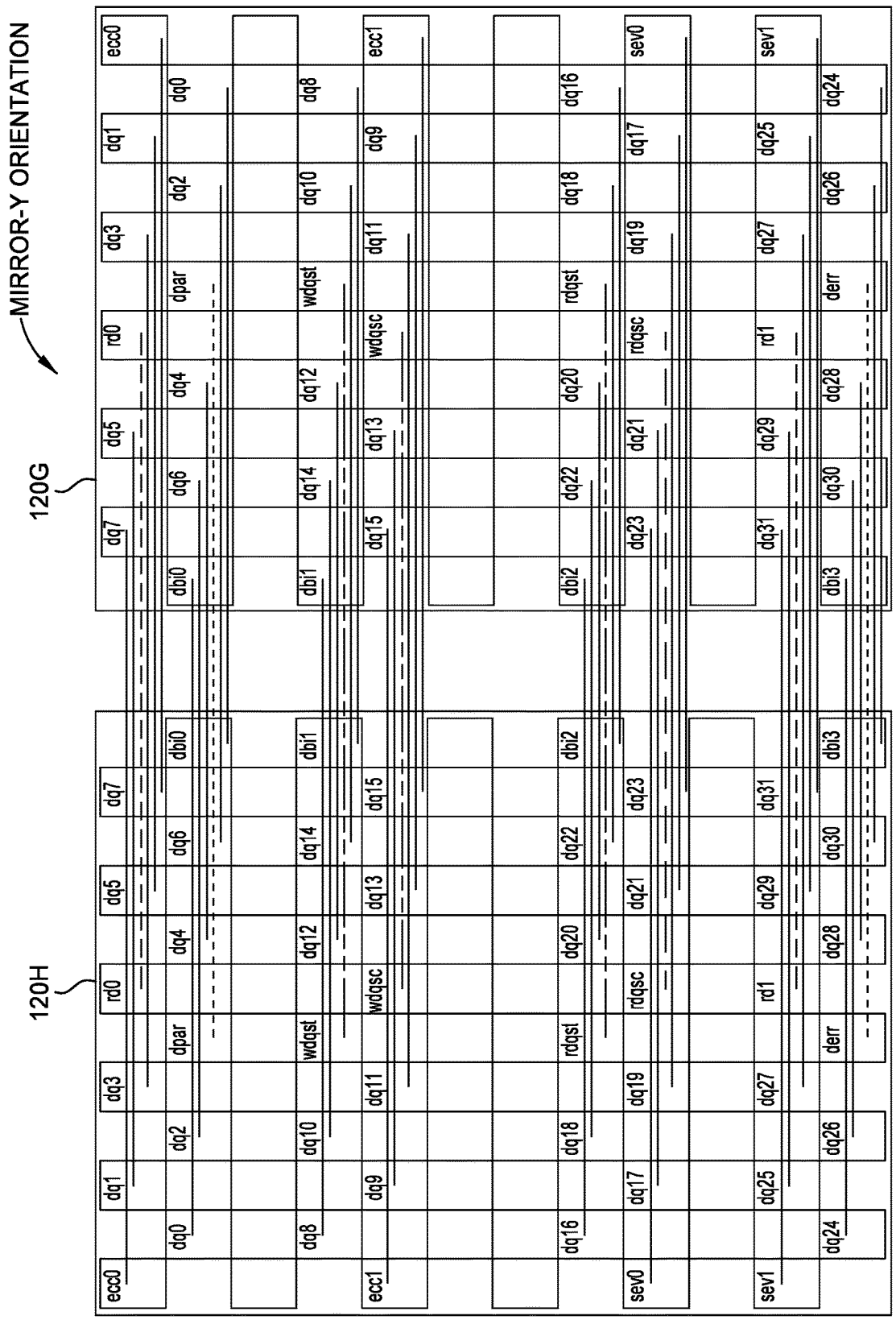
FIG. 10 illustrates a trace layout connecting two bump interface structures, according to an example.

At block 615, the bump interface structures transmit signals between each other which become jumbled due to connecting bump locations in the two interface structures that correspond to different signals (e.g., as shown in FIGS. 4B, 8, and 10).

At block 620, the reordering circuitry performs a byte level reordering to partially correct the jumbled signals. In this HBM3 example, "byte level" is a 10-bit byte as defined by its lane repair control word definition. In other embodiments, a "byte" can be a different group size than in this example (e.g., 8-bits, 12-bits, etc.).

The bump interface structure may support multiple data words (e.g., multiple 10-bit bytes) which might be switched when being transmitted between the interface structures. Using table 500 as an example, due to jumbling the signals, the first 10-bit byte (ecc0, dq0-dq7, and dbi0) should be switched with the fourth 10-bit byte (dbi3, dq31-dq23, sev1) and the second 10-bit byte (ecc1, dq8-dq15, dbi1) should be switched with the third 10-bit byte (dbi2, dq23-dq16, sev0). However, after these swaps are performed, the bits within the four bytes are still jumbled.

At block 625, the reordering circuitry performs a bit level reordering in each byte to partially correct the jumbled signals. For the rotated orientation 160 in FIG. 4B, the bits in each byte may need to be reversed in order. For example, after the signals are switched at the byte level, the bits are still in reverse order. Using the first byte as an example, dbi0 should be swapped with ecc0, dq7 should be swapped with dq0, dq6 should be swapped with dq1, dq5 should be swapped with dq2, and so forth. Thus, the reordering circuitry can perform a bit level reordering on each byte. Once performed, the four bytes shown in the first, third, fifth, and seventh columns of Table 500 are now reordered correctly. However, the byte-level and bit-level reordering performed at blocks 620 and 625 do not need to be performed in a particular order.

In addition to swapping the bytes of the data signals and reverse ordering the bits in each byte, additional reordering may be performed for the special signals in the bump interface structures. In one embodiment, the swapping of these special signals is performed by the reordering circuitry in the PHY while reordering the data signals can be performed by the reordering circuitry in the link layer. For example, the reordering circuitry in the PHY may swap the clock signals wdqs and rdqs (which are differential pairs), swap the true and complement polarity of wdqs and/or rdqs differential signals, swap rd0 and dpar, and swap rd1 with derr.

Further, for bump interface structures that support lane repair such as DWORD, bit level reordering at block 625 may have two variants: one when lane repair is not active, and another when it is. Generally, lane repair provides one or more redundant lanes or traces in the interposer that can be used if a lane or trace for the data signals is unusable. For DWORD, rd0 corresponds to a redundant lane that can be used by the first and second bytes while rd1 corresponds to a redundant lane that can be used by the third and fourth bytes. If lane repair is active, then the remaining bits on one side of the defective lane are shifted such that rd0 or rd1 are now used to carry a bit.

FIG. 7 is a table 700 indicating logic for lane repair between interface structures with different orientations, according to an example. Specifically, table 700 illustrates the two variants of bit-level reordering that can be performed. The first row indicates the bit-level reordering to be used when lane repair is not active while the second row indicates the bit-level reordering to be used when lane repair is active. In Table 700, the values 0-9 indicate each bit in the byte. When lane repair is not active, bits 0 and 9 are swapped, bits 1 and 8 are swapped, bits 2 and 7 are swapped, and so forth. However, when lane repair is active, a right shift is performed to compensate for the shift performed by the lane repair and then the bits can be swapped as indicated in the first row. In other words, lane repair has the effect of a "rotate 1 left" on the correct 10-bit byte.

Further, when one die has a different orientation, the lane repair in each die should account for the orientation difference. For example, in rotated orientation 160 in FIGS. 4A and 4B, one die may see the fourth bit in the third byte as defective, while the other die sees the defective signal as appearing in the seventh bit of the second byte.

FIG. 8 illustrates a trace layout connecting two bump interface structures 120, according to an example. In this example, the bump interface structure 120E has a "true" orientation where its top side is oriented at the top of the figure, while the interface structure 120F has been mirrored along the x-axis. That is, the structure 120F is flipped along the x-axis relative to the structure 120E such that the bump locations that are on the top of the structure 120E are now at the bottom of the structure 120F, the second row to the top of the structure 120E is the second row from the bottom of the structure 120F, and so forth.

Nonetheless, a trace routing scheme as shown in FIG. 3 is used here so that the traces 125 are parallel each other. However, doing so jumbles the signals in a different way than the signals were jumbled in FIG. 4B. Nonetheless, the reordering circuitry in the PHY and link layers can be configured to use blocks 620 and 625 of the method 600 in order to correct (or reorder) the signals. At the byte level, bytes (10-bits each) are in reverse order. As an example, the first byte (containing ecc0, dq0-dq7 and dbi0) is connected to fourth byte. Thus, the signals in the first byte are swapped with the signals in the fourth byte and the signals in the second byte are swapped with the signals in the third byte.

At the bit level, the reordering pattern is as shown in table 900 in FIG. 9. There are six variants (variants 0-5) of internal bit reordering, depending on whether lane repair is used or not, and which lane has been repaired. The reordering circuitry can determine whether lane repair is active, and if so, identify which lanes are being repaired. With this information, the reordering circuitry can then reference a data structure containing the information shown in the table 900 to determine how to perform the bit-level reordering in each of the bytes. For example, if the first byte does not have any signals relying on lane repair, then the first variant is used. However, if the second byte does have a signal relying on lane repair, then the reordering circuitry identifies which lane and selects the corresponding variant. In this manner, the reordering circuitry can select a variant for each byte to use according to whether that particular byte is using lane repair and which lanes (or bits) within the byte are being repaired.

FIG. 10 illustrates a trace layout connecting two bump interface structures, according to an example. In this example, the bump interface structure 120G has a "true" orientation where its top side is oriented at the top of the figure, while the interface structure 120H has been mirrored along the y-axis. That is, the structure 120H is flipped along the y-axis relative to the structure 120G such that the bump locations that are on the rightmost column of the structure 120G are now on the leftmost column of the structure 120F, the second to rightmost column of the structure 120G is the second to leftmost column of the structure 120H, and so forth.

Nonetheless, a trace routing scheme as shown in FIG. 3 is used here so that the traces 125 are parallel each other to avoid crisscrossing. However, doing so jumbles the signals in a different way than the signals were jumbled in FIGS. 4B and 8. Nonetheless, the reordering circuitry in the PHY and link layers can be configured to correct or reorder the signals.

With the orientation in FIG. 10, byte-level reordering is not needed. That is, the first byte in the interface structure 120G is connected to the first byte in the interface structure 120H. Thus, only reordering of the bits in each byte is performed. Put differently, the orientation in FIG. 10 does not need byte-level reordering, and thus, the reordering circuitry can skip this step when being used to correct signals transmitted using bump interface structures orientated as shown in FIG. 10.

FIG. 11 is a table 1100 for reordering the bits in the bytes corresponding to FIG. 10, according to an example. As above, the reordering circuitry can determine whether lane repair is active, and if so, which lane is being repaired. With this information, the reordering circuitry can identify using a data structure like shown in table 1100 to determine how to reorder the bits in each of the bytes.

Connecting Different Bump Interface Structures

The discussion corresponding to FIGS. 3-11 concerned connected bump interface structures that are the same, but with different orientations. The discussion below describes connecting different bump interface structures. For example, one of the bump interface structures may be smaller than the other interface. As a non-limiting example, the HBM3 standard defines an AWORD bump interface structure that is smaller than the DWORD interface. It may be advantageous to connect the AWORD to the DWORD interface so that the main die can have only DWORD interfaces that are able to connect to secondary dies that have AWORD interfaces (using the techniques discussed below) or connect to secondary dies that have DWORD interfaces (using the technique discussed above).

Figure 12:
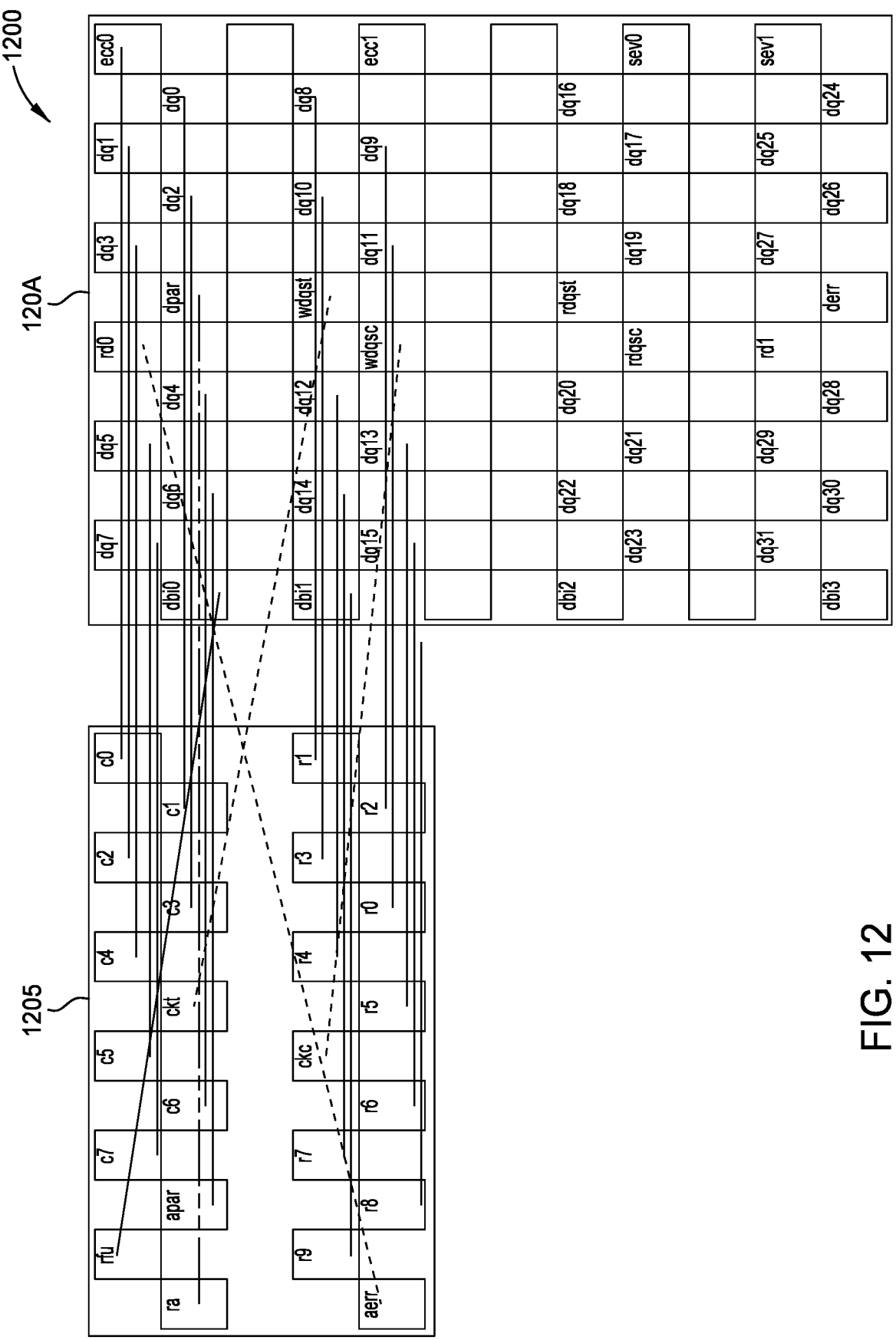
FIG. 12 illustrates a trace layout connecting two bump interface structures, according to an example.

FIG. 12 illustrates a trace layout connecting two bump interface structures in a true orientation 1200, according to an example. Specifically, FIG. 12 illustrates a first bump interface structure 1205 (i.e., an AWORD) connecting to a second bump interface structure 120A (i.e., a DWORD as discussed above). The AWORD includes 24 signals including an eight column command bits (c0-c7), ten row command bits (r0-r9), parity (apar), reserved (rfu), parity error (aerr), two clock signals (ckt, ckc), and 1 redundant signal for lane repair (ra). An AWORD can also be viewed as having two bytes, where each byte is a 10-bit quantity. The JEDEC HBM3 standard specifies that in the bottom half of the HBM footprint, all the DWORDs and AWORDs are mirrored about the X axis.

Previously, a main die would need AWORD bump interface structures in order to connect to a secondary word having AWORD bump structures (e.g., a HBM secondary chip). However, the embodiments herein describe techniques for connecting DWORDs to AWORDs which give the main die greater flexibility since it can now connect to secondary dies with either type of interface. The discussion below describes how to connect the DWORDs in the main die to the AWORDs in the secondary die in a way that minimizes signal jogging and signal crisscrossing. Further, the embodiments describe connecting command/address output or data input/output of the HBM controller in the main die to the DWORD PHY while maintaining correct HBM operation, and how to reorder the signals in the presence of lane repair events. The embodiments herein also support true orientations where the DWORD and AWORD interfaces have the same orientation, and orientations were the AWORD is mirrored along the x-axis.

FIG. 13 is a table 1300 indicating the mapping between the two bump interface structures in FIG. 12, according to an example. To maintain lane repair functionality, the rd0 redundant wire of the DWORD (e.g., interface 120A in FIG. 12) can be connected to the ra redundant wire of the AWORD (e.g., the interface 1205 in FIG. 12). However, doing so creates crisscrossing wires that have to be handled using multiple layers in the interposer, which is undesirable. To avoid the wires crisscrossing, the C2C PHY can support a feature allowing the physical swapping of the rd0 with dpar signals. As shown in FIG. 12, dpar in the interface 120A is connected to ra in the interface 1205. This feature can be enabled by reordering circuitry in the PHY. While FIG. 12 illustrates some signals that crisscross, much of the complexity has been minimized using the connection scheme illustrated in FIG. 12, thus reducing the routing problem for the interposer.

Figure 14:
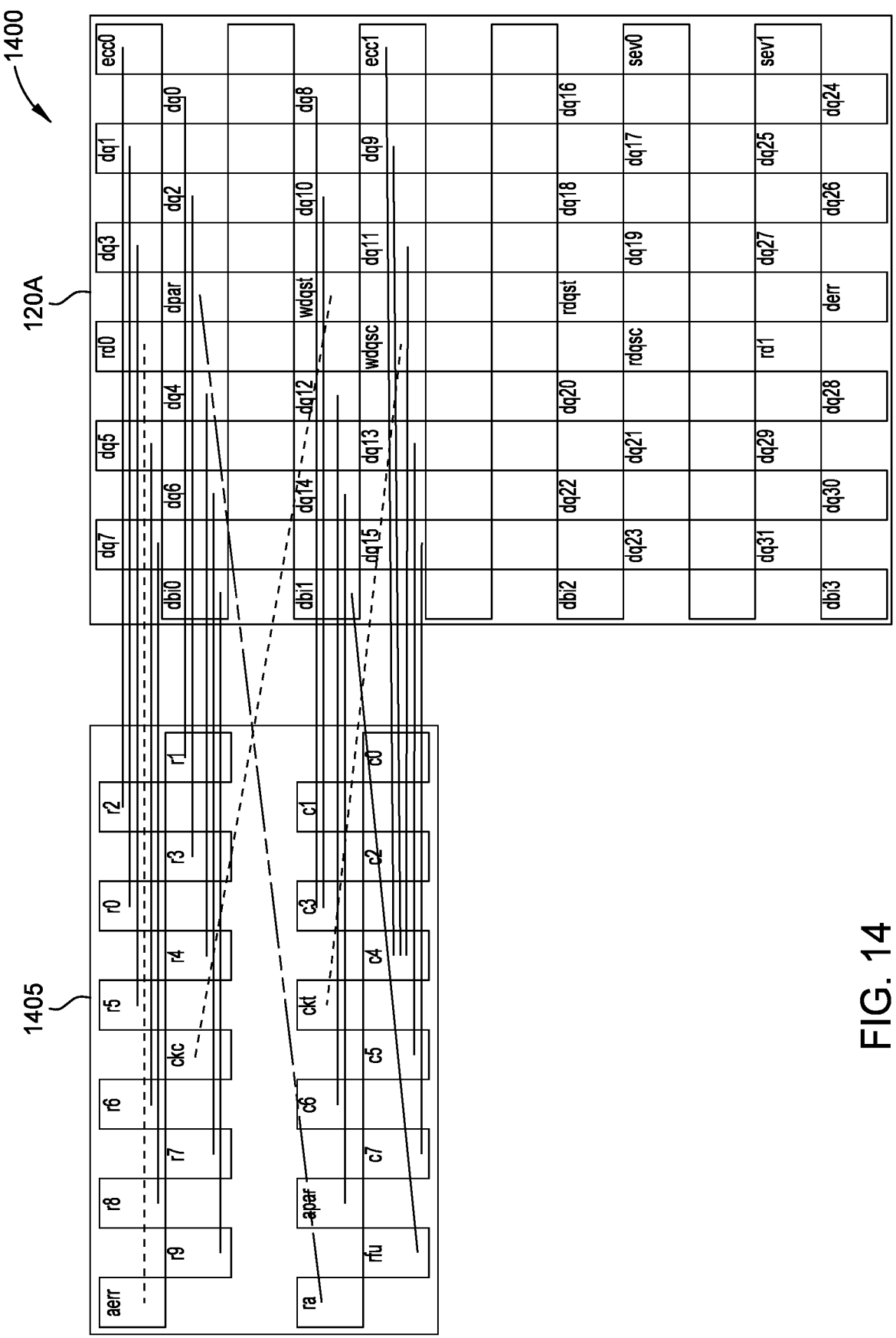
FIG. 14 illustrates a trace layout connecting two bump interface structures, according to an example.

FIG. 14 illustrates a trace layout connecting two bump interface structures in a mirrored orientation 1400, according to an example. In this example, an AWORD bump interface structure 1405 is mirrored along the x-axis relative to the AWORD interface 1205 illustrated in FIG. 12. FIG. 12 also illustrates the traces used in the interconnect to couple the interface 1405 to the DWORD bump interface structure 120A.

FIG. 15 is a table 1500 indicating the mapping between the two bump interface structures in FIG. 14, according to an example. Like the true orientation 1200 in FIG. 12, in the mirror orientation 1400 the rd0-dpar signal is swapped using the reordering circuitry in the PHY. In addition, and for the same reason, the true/complement polarity clock signals can be swapped in the PHY.

Internal reordering for the AWORD may be performed for two reasons: (1) the reordering is different between the true and mirrored orientations shown in FIGS. 12 and 14 and (2) the reordering depends on whether lane repair has occurred, and if so, which lane was repaired. The internal reordering ensures alignment between the DWORD and AWORD lane repair mechanism and maintains lane repair support in all case.

For ease of explanation, each signal is assigned a byte-oriented numerical ID in the range 0-9 as shown by the table 1600 in FIG. 16. The numerical ID is ordered the same way the lane repair chain is ordered and covers only the forty repairable signals of a DWORD or twenty repairable signals in an AWORD. Table 1600 also includes an exception in the sequential order of the AWORD row command (r1, r2, r3, then r0), as specified in the JEDEC HBM3 specification.

In one embodiment, the reordering circuitry can use two modes of reordering the AWORD-DWORD interface at the byte-level. When the true orientation 1200 in FIG. 12 is used, a first mode of byte-level reordering is performed. The first mode includes a default order at the (10-bit) byte level where the DWORD byte 0 is connected to the column command in the AWORD, DWORD byte 1 is connected to the row command in the AWORD, and DWORD bytes 2 and 3 are not used. Within each 10-bit byte, bit reordering is described below using the tables in FIG. 17.

When the mirrored orientation 1400 in FIG. 14 is used, a second mode of byte-level reordering is performed. The second mode includes a reverse order at the (10-bit) byte level where the DWORD byte 0 is connected to the row command in the AWORD, DWORD byte 1 is connected to the column command in the AWORD, and DWORD bytes 2 and 3 are not used. Within each 10-bit byte, bit reordering is described below using the tables in FIG. 17.

Figure 17:
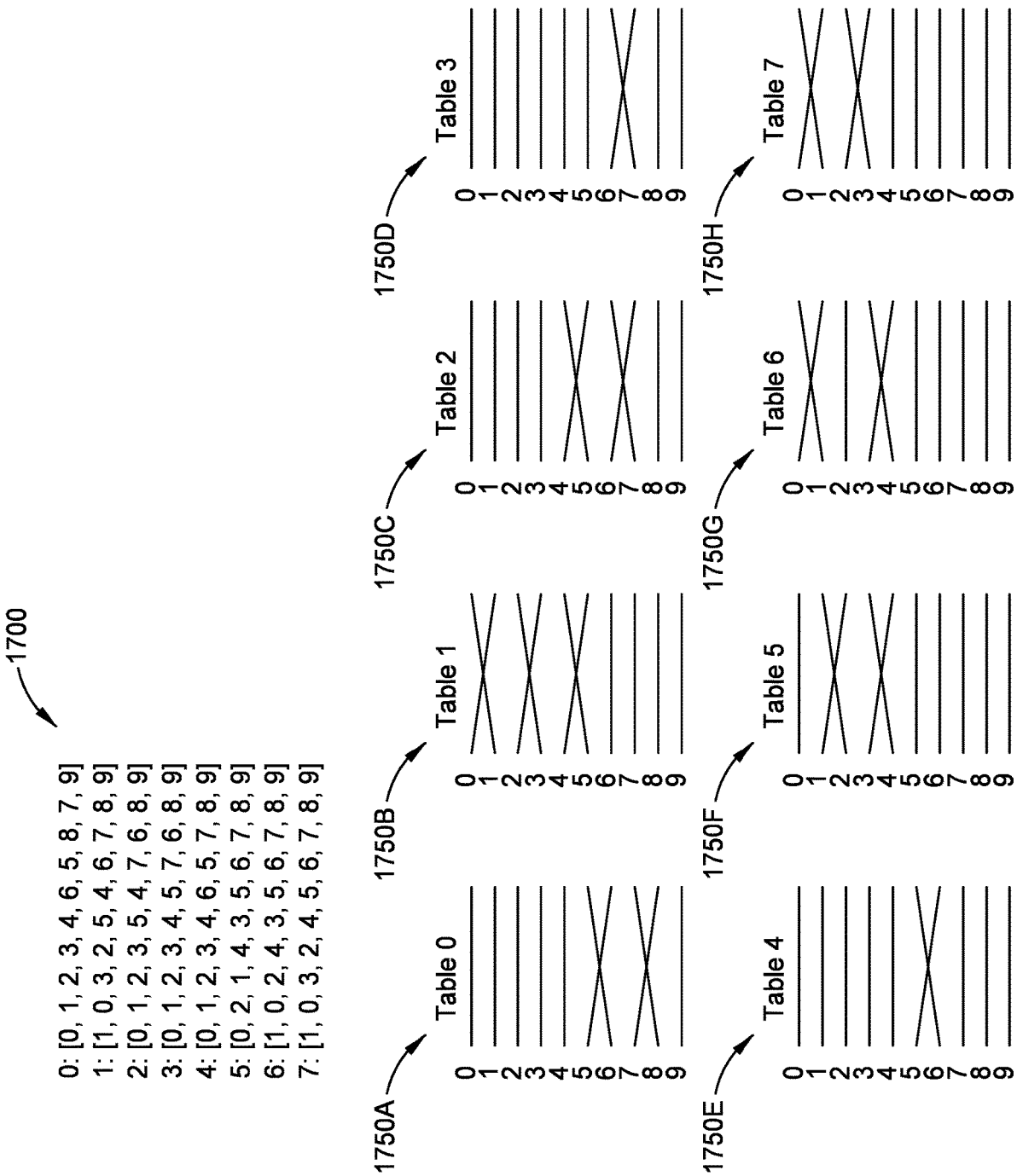
FIG. 17 includes tables corresponding to the rows of the table in FIG. 16, according to an example.

FIG. 17 illustrates a first table 1700 and eight byte tables 1750A-H which each correspond to a row of the first table 1700. The first table 1700 illustrates eight unique internal byte reordering schemes for AWORD-DWORD connections. The schemes are the same whether the true or mirrored orientations are used.

The table 1750A corresponds to the reordering scheme in row 1 of the table 1700, the table 1750B corresponds to the reordering scheme in row 2 of the table 1700, the table 1750C corresponds to the reordering scheme in row 3 of the table 1700, and so forth. FIG. 18 provides a table 1800 indicating in what situations each of the eight reordering schemes illustrated in FIG. 17 is used, depending on the orientation (true or mirrored (MX)) and lane repair. The TXbyte and TXbit are the lane repair values programmed on the TX side (−1 means no repair). The RXbyte and RX bit are the lane repair values programmed on the RX side (−1 means no repair). The Byte0/1 Table is which table (ID 0-7) in FIG. 17 is applied to that byte under the specified lane repair conditions.

Note that due to the nature of the external connections used for true and mirrored orientations, the programming of the lane repair may be different in the main die and in the HBM stack (e.g., the secondary HBM dies). The values of TXbyte/bit and RXbyte/bit in the table 1800 indicate how to handle this situation.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A multiple die system, comprising:
   an interposer;
   a first die comprising:
      a first set of electrical connections connected to the interposer; and
      a first communication layer coupled to the first set of electrical connections and comprising first reordering circuitry; and
   a second die comprising:
      a second set of electrical connections connected to the interposer; and
      a second communication layer coupled to the second set of electrical connections and comprising second reordering circuitry,
   wherein the interposer comprises a plurality of traces electrically connecting the first and second sets of electrical connections such that the plurality of traces connect different signals of the first and second sets of electrical connections to each other.

2. The multiple die system of claim 1, wherein the first and second reordering circuitry correct the different signals that are jumbled by the plurality of traces in the interposer.

3. The multiple die system of claim 1, wherein the first and second communication layers are link layers in the first and second dies, and wherein the first and second dies also comprise physical layers comprising reordering circuitry for correcting the different signals that are jumbled by the plurality of traces in the interposer, wherein the reordering circuitry in the physical layers is configured to compensate for jumbled signals corresponding to a lane repair scheme for correcting errors in the plurality of traces in the interposer.

4. The multiple die system of claim 1, wherein the different signals are jumbled so that the plurality of traces are routed on a same layer in the interposer.

5. The multiple die system of claim 1, wherein the first and second sets of electrical connections are a same interface structure that define the same signals, but one of the first and second sets of electrical connections has a different relative orientation.

6. The multiple die system of claim 5, wherein the first and second sets of electrical connections define DWORDs as defined by a Joint Electron Device Engineering Council (JEDEC) high bandwidth memory (HBM) standard.

7. The multiple die system of claim 1, wherein the first and second sets of electrical connections define a different number of signals such that the first set of electrical connections is smaller than the second set of electrical connections, wherein the first set of electrical connections is an AWORD as defined by a JEDEC HBM standard and the second set of electrical connections is a DWORD as defined by the JEDEC HBM standard.

8. The multiple die system of claim 1, wherein the first and second sets of electrical connections have at least one of (i) different orientations relative to each other or (ii) one of the first and second sets of electrical connections has fewer signals than the other.

9. A method, comprising:
   providing a multiple die system comprising two dies with respective sets of electrical connections interconnected by an interposer such that different signals defined by the respective sets of electrical connections are connected to each other by the interposer;
   transmitting the different signals between the two dies; and
   performing a bit-level reordering within multiple bytes of data in the different signals.

10. The method of claim 9, further comprising:
    performing a byte-level reordering by swapping at least one byte of data in the different signals with a second byte.

11. The method of claim 10, wherein the bit-level and byte-level reordering is performed in at least one of a link layer or a physical layer in the two dies.

12. The method of claim 11, wherein portions of the bit-level and byte-level reordering are performed in both the link layer and the physical layer, wherein the reordering performed in the physical layer is to compensate for jumbled signals corresponding to a lane repair scheme for correcting errors in traces in the interposer.

13. The method of claim 11, further comprising:
    identifying at least one of a type or orientation of the respective sets of electrical connections; and
    selectively activating reordering circuitry in at least one of the link layer or the physical layer based on the type or the orientation.

14. The method of claim 13, wherein the respective sets of electrical connections are a same interface structure that defines the same signals, but have different relative orientations on the two dies.

15. The method of claim 13, wherein the respective sets of electrical connections define a different number of signals such that one of the respective sets of electrical connections is smaller than the other.

16. An integrated circuit, comprising:
- a first set of electrical connections configured to connect to an interposer, wherein the interposer permits the first set of electrical connections to communicate with a second set of electrical connections in a different integrated circuit; and
- a communication layer coupled to the first set of electrical connections and comprising reordering circuitry, wherein the reordering circuitry is configured to correct jumbled signals received at the first set of electrical connections due to traces in the interposer connecting different signals, as defined by the first and second sets of electrical connections, to each other.

17. The integrated circuit of claim 16, wherein the communication layer is a physical layer, wherein the reordering circuitry is configured to compensate for the jumbled signals corresponding to a lane repair scheme for correcting errors in the interposer.

18. The integrated circuit of claim 17, further comprising:
- a link layer coupled to the physical layer, the link layer comprising different reordering circuitry for correcting data signals in the jumbled signals.

19. The integrated circuit of claim 16, wherein the jumbled signals are jumbled due to at least one of (i) different orientations between the first and second sets of electrical connections, or (ii) one of the first and second sets of electrical connections defining fewer signals than the other.

20. The integrated circuit of claim 16, wherein one of:
- the first and second first and second sets of electrical connections are DWORDs as defined by a Joint Electron Device Engineering Council (JEDEC) high bandwidth memory (HBM) standard, or
- the first set of electrical connections is a DWORD as defined by a JEDEC HBM standard and the second set of electrical connections is an AWORD as defined by the JEDEC HBM standard.

* * * * *